US010215938B2

(12) United States Patent
Chang et al.

(10) Patent No.: US 10,215,938 B2
(45) Date of Patent: *Feb. 26, 2019

(54) PHOTOELECTRIC CONVERSION ASSEMBLY

(71) Applicant: AQUAOPTICS CORP., Hsinchu County (TW)

(72) Inventors: Chia-Chi Chang, Hsinchu County (TW); Shih-Jye Yo, Hsinchu County (TW)

(73) Assignee: AQUAOPTICS CORP., Hsinchu County (TW)

( * ) Notice: Subject to any disclaimer, the term of this patent is extended or adjusted under 35 U.S.C. 154(b) by 308 days.

This patent is subject to a terminal disclaimer.

(21) Appl. No.: 15/179,980

(22) Filed: Jun. 11, 2016

(65) Prior Publication Data

US 2017/0269316 A1    Sep. 21, 2017

(30) Foreign Application Priority Data

Mar. 16, 2016    (TW) .............................. 105108167 A

(51) Int. Cl.
*H03F 3/08*    (2006.01)
*G02B 6/42*    (2006.01)
*G02B 6/32*    (2006.01)
*G02B 6/38*    (2006.01)
(Continued)

(52) U.S. Cl.
CPC ............. *G02B 6/4295* (2013.01); *G02B 6/32* (2013.01); *G02B 6/3882* (2013.01); *G02B 6/3885* (2013.01); *G02B 6/425* (2013.01); *G02B 6/428* (2013.01); *G02B 6/4214* (2013.01); *G02B 6/4245* (2013.01); *G02B 6/4278* (2013.01); *G02B 6/4292* (2013.01); *G02B 6/43* (2013.01); *H01L 24/81* (2013.01); *H03F 3/08* (2013.01); *G02B 6/4281* (2013.01)

(58) Field of Classification Search
CPC ...... G02B 6/32; G02B 6/4295; G02B 6/4292; G02B 6/428; G02B 6/4245; G02B 6/3882; G02B 6/425; G02B 6/4278; G02B 6/43; G02B 6/4214; G02B 6/3885; H03F 3/08; H01L 24/81
USPC ...................................................... 250/214 A
See application file for complete search history.

(56) References Cited

U.S. PATENT DOCUMENTS 9,581,776 B1 *    2/2017  Lee ...................... G02B 6/4292
2006/0280410 A1 * 12/2006  Fujiwara ............... G02B 6/4214
                                                                    385/88

(Continued)

*Primary Examiner* — Georgia Y Epps
*Assistant Examiner* — Kevin Wyatt
(74) *Attorney, Agent, or Firm* — Chih Feng Yeh; Huntington IP Consulting Co., Ltd.

(57) ABSTRACT

A photoelectric conversion assembly is proposed. The photoelectric conversion assembly comprises a photoelectric conversion module having an interposer, at least one optical element and an optical bench. The at least one optical element is configured on the interposer, and the optical bench is used to support for the interposer. A circuit board is used to support for the photoelectric conversion module, having metal pads for coupling the at least one optical element. An optical transmission component is used for transmitting light. An optical ferrule is used for engaging with the photoelectric conversion module and an optical transmission component. A plug is used for electrically connecting the circuit board.

20 Claims, 13 Drawing Sheets

(51) Int. Cl.
G02B 6/43 (2006.01)
H01L 23/00 (2006.01)

(56) References Cited

U.S. PATENT DOCUMENTS

2007/0258683 A1* 11/2007 Rolston ................ G02B 6/4232
385/88
2012/0241795 A1* 9/2012 Chang .................. G02B 6/4201
257/98

* cited by examiner

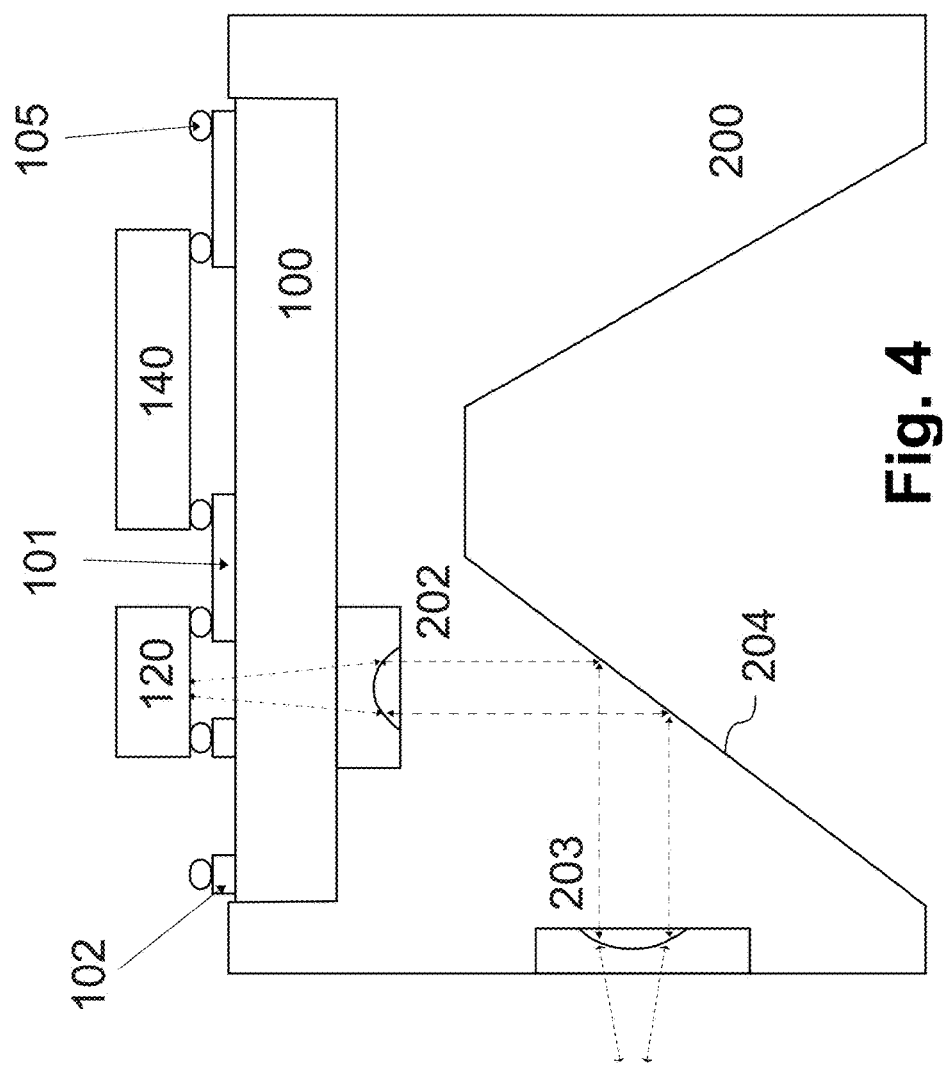

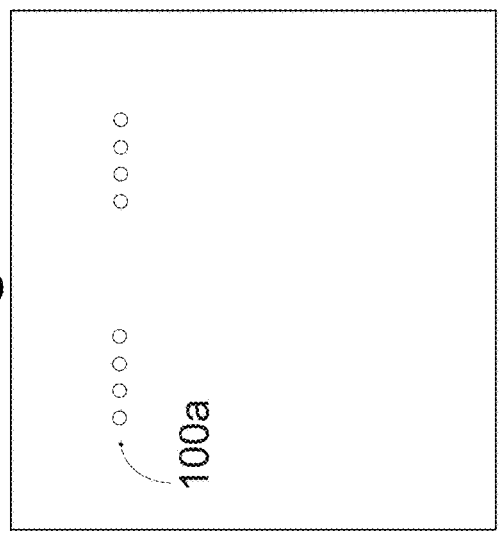
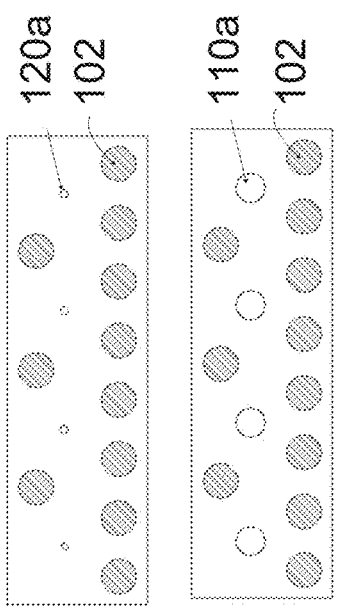
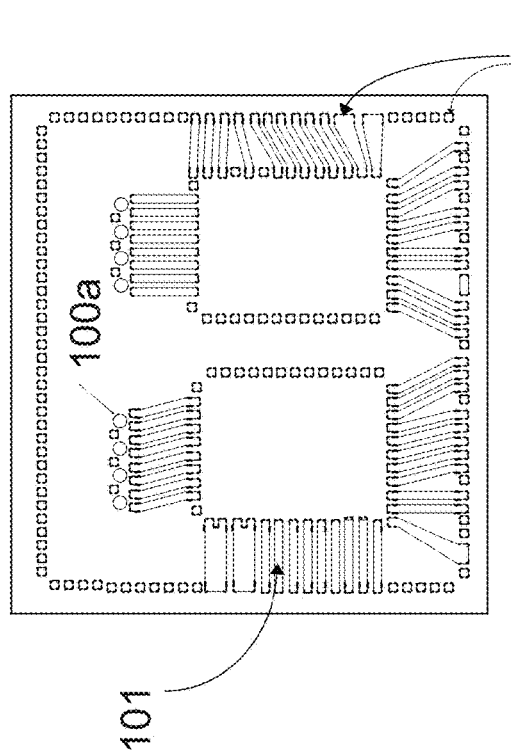

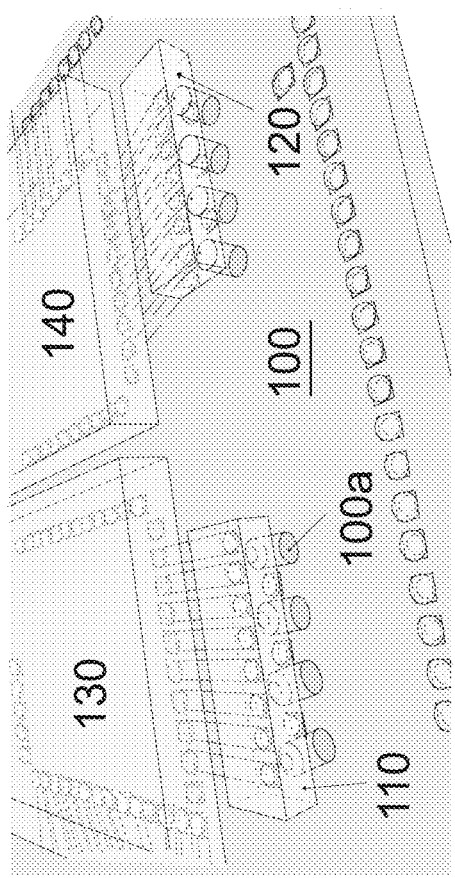
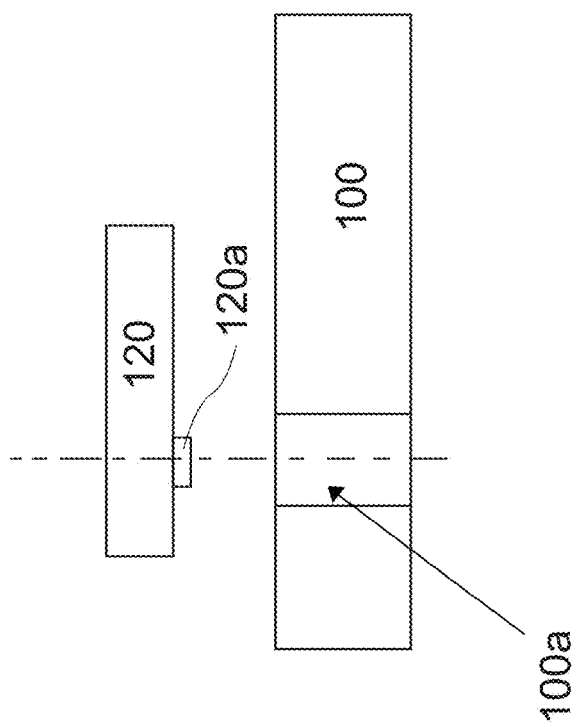
Fig. 7B
Fig. 7A

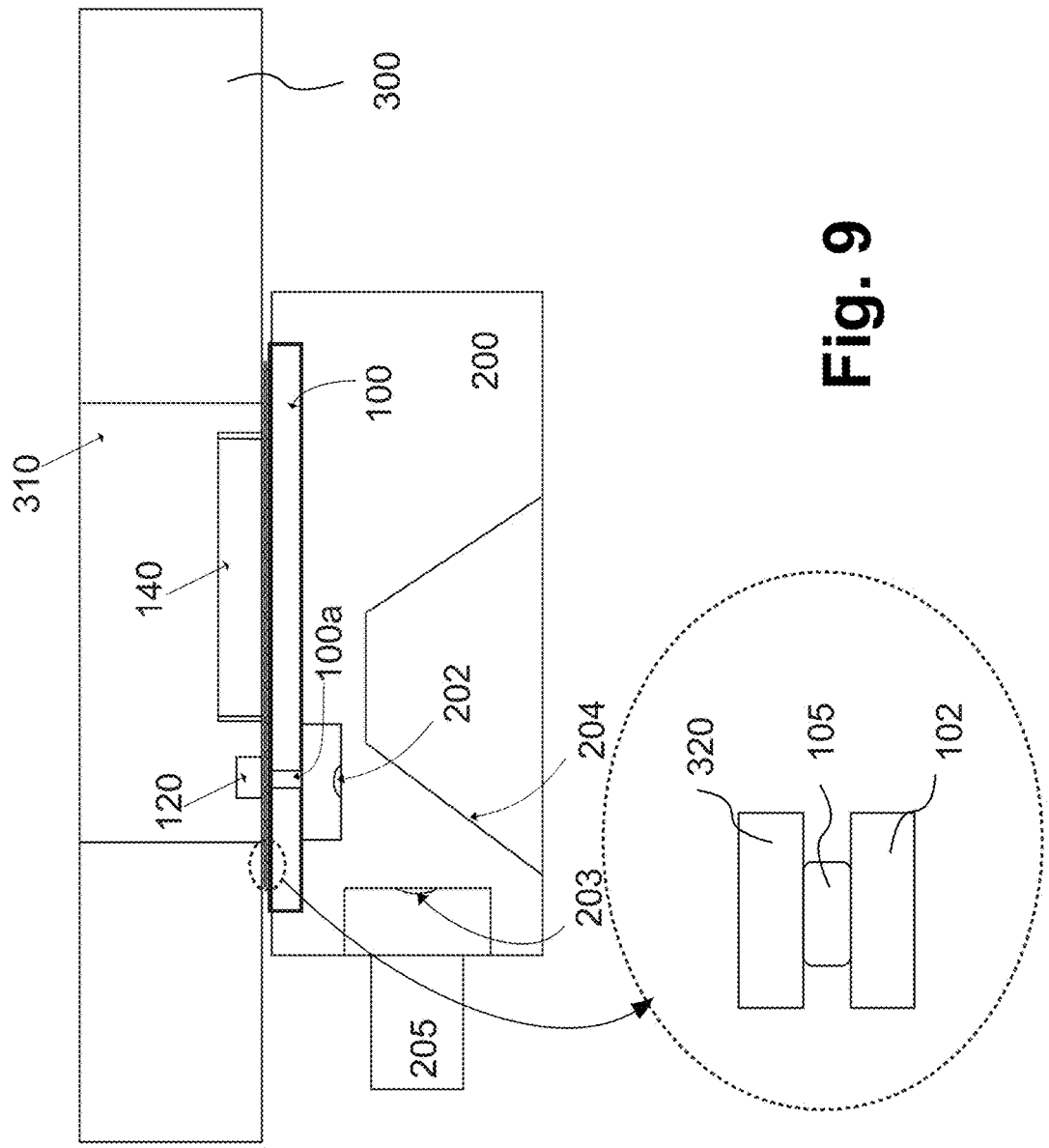

PHOTOELECTRIC CONVERSION ASSEMBLY

CROSS REFERENCE TO RELATED APPLICATIONS

This non-provisional application claims priority under 35 U.S.C. § 119(a) on Patent Application No(s). 105108167 filed in Taiwan, R.O.C. on Mar. 16, 2016, the entire contents of which are hereby incorporated by reference.

BACKGROUND

Technical Field

The present invention relates to a photoelectric device, and more particularly, to a photoelectric conversion assembly to provide signal transmission and conversion between the optical devices and electrical devices.

Description of Related Art

Light beams or optical signals are frequently used to transmit digital data between electronic devices, both over long distances and between adjacent circuit boards. A light beam may be modulated as needed to carry data. An optical signal may also be used for other purposes including position or motion sensing, measurement, etc.

Typically, a typical multi-fiber optic connector includes a ferrule assembly supported at a distal end of a connector housing. The ferrule assembly can include a multi-fiber ferrule mounted in a hub. A spring is used to bias the ferrule assembly in a distal direction relative to the connector housing. The multi-fiber ferrule functions to support the end portions of multiple optical fibers. The multi-fiber ferrule has a distal end face at which polished ends of the optical fibers are located. When two multi-fiber optic connectors are interconnected, the distal end faces of the multi-fiber ferrules oppose and are biased toward one another by their respective springs. With the multi-fiber optic connectors connected, their respective optical fibers are coaxially aligned such that the end faces of the optical fibers directly oppose one another. In this way, optical signals can be transmitted from one optical fiber to another optical fiber through the aligned end faces of the optical fibers.

Systems for interconnecting optical fibers typically utilize mating ferrule assemblies to facilitate handling and accurate positioning of the fibers. The optical fibers are secured within a ferrule body, with an end surface of each fiber being positioned generally flush with or slightly protruding from an end face of the ferrule body. The end surfaces or faces of the fibers are then polished to a desired finish. When complementary ferrules assemblies are mated, each optical fiber of a ferrule assembly is coaxially positioned with a mating optical fiber of the other ferrule assembly. In some applications, the end faces of the mating optical fibers physically contact one another in order to effect signal transmission between the mating optical fiber pair. In such applications, various factors may reduce the efficiency of the light transmission between the optical fiber pair.

Consequently, optical technology plays a significant role in modern electronic devices, and many electronic devices employ optical components. Examples of such optical components include optical or light sources such as light emitting diodes and lasers, waveguides, fiber optics, lenses and other optics, photo-detectors and other optical sensors, optically-sensitive semiconductors, and others.

The use of the optical fibers requires photoelectric conversion modules to convert electrical signals to optical signals, or optical signals to electrical signals. Also, the photoelectric conversion modules are attached to be fixed to ends of the optical fibers, or to be attachable to or detachable from ends of the optical fibers.

SUMMARY OF THE INVENTION

In this invention, a photoelectric conversion assembly is proposed. The photoelectric conversion assembly comprises a photoelectric conversion module, a circuit board used to support the photoelectric conversion module, wherein the circuit board has a first conductive pads coupled to the photoelectric conversion module. An optical transmission member is for transmitting light. An optical ferrule is engaged with the photoelectric conversion module and the optical transmission member. A plug is coupled to the circuit board.

The photoelectric conversion module comprises an interposer with conductive trace and second conductive pads and an optical bench. At least one optical element is configured on the interposer to couple to the conductive trace and the second conductive pads. The optical bench has a fixing portion for supporting and positioning the interposer. A first lens array is configured under the interposer to align the at least one optical element. A mirror is configured under the first lens array, with an optical micro-reflection surface for bending light emitted by the at least one optical element. A second lens array is configured left side of the mirror for guiding light emitted by the at least one optical element.

According to one aspect, the optical bench has a first concave portion for the first lens array formed thereon and a second concave portion for the second lens array formed thereon. The arrangement orientation of the first lens array is the same as the second lens array. The first lens array, the second lens array and the mirror are formed on the optical bench.

According to another aspect, the photoelectric conversion module further comprises conductive bumps formed on and coupled to the conductive trace and the second conductive pads. At least one IC is configured on the interposer to couple to the conductive trace of the interposer.

According to yet another aspect, the interposer is attached on the configuration area of the optical bench by using an adhesive material.

A size of the interposer is less than or equal to a size of the optical bench.

The photoelectric conversion module further comprises a guide pin for engaging with the optical ferrule and the optical bench. The photoelectric conversion module further comprises a plug coupled to the circuit board. The interposer has at least one through hole passing through a top surface to a bottom surface of the interposer. At least one IC or at least one passive component (such as resistor, capacitor, inductor) is configured on the circuit board. The circuit board has a concave portion for receiving the at least one optical element on the interposer

BRIEF DESCRIPTION OF THE DRAWINGS

The components, characteristics and advantages of the present invention may be understood by the detailed descriptions of the preferred embodiments outlined in the specification and the drawings attached:

FIG. 4 illustrates an optical operational mechanism of the photoelectric conversion module according to one embodiment of the invention;

FIG. 6A illustrates a top view showing the interposer with a plural through holes according to an embodiment of the invention;

FIG. 6B illustrates a back view showing the interposer with a plural through holes according to an embodiment of the invention;

FIG. 7A illustrates a schematic perspective view showing an active area of a light source chip and a light receiving element aligning to the through hole of the interposer according to an embodiment of the invention;

FIG. 7B illustrates a schematic perspective view showing active components configured on the interposer according to an embodiment of the invention;

FIG. 9 illustrates a perspective view showing the photoelectric conversion assembly packaged on a circuit board according to one embodiment of the invention;

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

The photoelectric conversion assembly may be applied to an active optical cable (AOC), or provides signal transmission and conversion between the optical devices and electrical devices. In various applications, the active optical cable may include a photoelectric composite cable (hybrid cable), or an optical fiber and photoelectric conversion assembly configured two ends of the active optical cable. The photoelectric composite cable (hybrid cable) is composed of optical fiber and electrical wire. The active optical cable or the photoelectric conversion assembly may be used for unidirectional transmission or bidirectional transmission. The photoelectric conversion assembly may be applied to a high speed transmission interface, such as USB (Universal Serial Bus), HDMI (High Definition Multimedia Interface), Lighting or Thunderbolt interface, for cable consumer products, or applied to a transmission interface, such as storage BUS including Fiber Channel (FC), SAS (Serial Attached SCSI), PCIe (PCI Express) or SATA (Serial Advanced Technology Attachment), for photoelectric products or equipment. In one embodiment, the active optical cable is used for an electrical connection between digital video devices or apparatus. The photoelectric conversion assembly may be as an optical transmitter or an optical receiver, for unidirectional transmission. In another embodiment, the photoelectric conversion assembly may be as an optical transceiver for bidirectional transmission.

Figure 1:
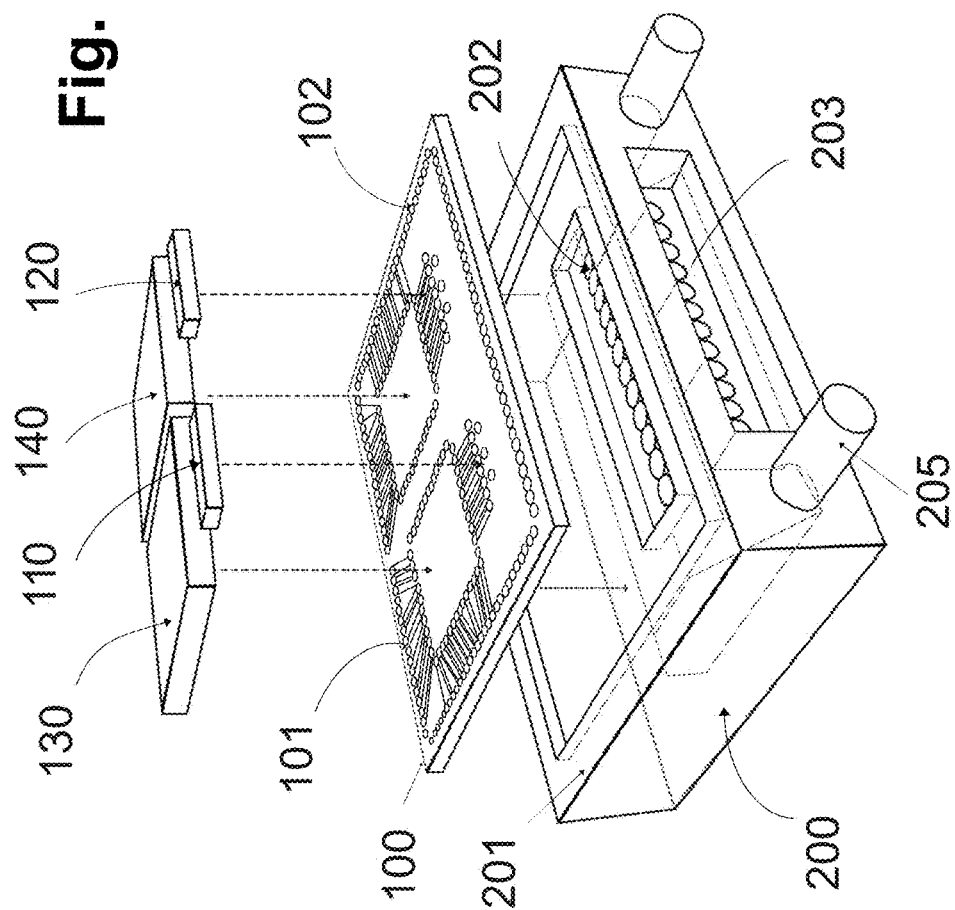
FIG. 1 illustrates a schematic perspective view showing a photoelectric conversion module according to an embodiment of the invention.

FIG. 1 illustrates a schematic perspective view showing a photoelectric conversion module according to an embodiment of the invention. The photoelectric conversion module comprises optical components, an interposer 100 and an optical bench 200. The optical components are configured on the interposer. The optical components are, for example a light source chip (such as (Vertical-Cavity Surface-Emitting Laser); VCSEL) 120, and a light receiving element (such as a photodiode (PD), a photo detector chip) 110, configured on the interposer 100. In one embodiment, ICs 130, 140 are configured on a top surface of the interposer 100. Moreover, conductive (metal) trace 101 and conductive (metal) pads 102 may be formed (configured) on the interposer 100 for electrically connecting with the light source chip 120, the light receiving element 110 and external circuits. In one embodiment, the conductive (metal) pads 102 may be designed to configure on the periphery of the configuration area of the light source chip 120, the light receiving element 110, ICs 130 and 140, and the periphery of the top surface of the interposer 100. Two ends of the conductive (metal) trace 101 have conductive (metal) pads 102 formed thereon, which functions include (1) coupling to the light source chip 120, the light receiving element 110, ICs 130 and 140, and (2) coupling to the external circuits. Some of the conductive (metal) pads 102 on the periphery of the top surface of the interposer 100 are not directly connected to the active component. These bonding pads 102 are used to be as function of support when the interposer 100 is mounted on the external circuit board, and can disperse the heat source generated by the active components.

Figure 2:
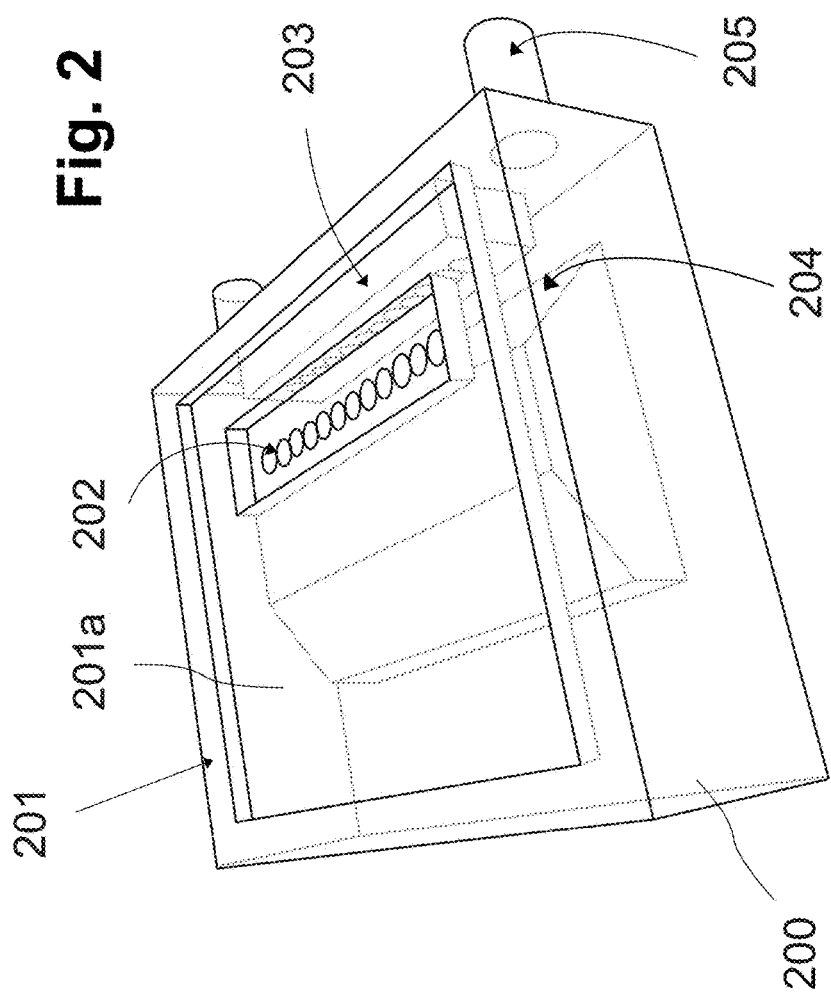
FIG. 2 illustrates a perspective view showing an optical bench of the photoelectric conversion module according to an embodiment of the invention.

As shown in FIG. 2, the optical bench 200 is designed to have a fixing portion 201, a concave portion 201a, a lens array 202, a lens array 203, a mirror 204 and guide pins 205. The fixing portion 201 is used for supporting and guiding the interposer 100. In one embodiment, the fixing portion 201 is a sidewall of the concave portion 201a. In one embodiment, the concave portion 201a has a square-shaped. The interposer 100 is locked by the sidewall of the fixing portion 201 for reaching the purpose to support and guide the interposer 100.

The concave portion 201a of the optical bench 200 is utilized to configure and fix the interposer 100 on the optical bench 200, and thus the interposer 100 is configured within the concave portion 201a. The optical bench 200 can be as a connector body. In one embodiment, the optical bench 200 can be fabricated by an injection molding process, for example a plastic injection molding process, to form the fixing portion (configuration area) 201, the concave portion 201a, the lens array 202, the lens array 203, the mirror 204 and the guide pins 205. That is, in this embodiment, the optical bench 200 includes two lens array 202 and 203, the mirror 204, the fixing portion 201 and the guide pins 205. The mirror 204 is formed at rear side of the optical bench 200, locating on the concave portion. The fixing portion 201 is used to support the interposer 100 such that the interposer 100 is inserted into the configuration area 201. Besides, the fixing portion 201 may be used to assist the interposer for positioning. In one embodiment, the configuration area 201 is formed to a square-shaped with a concave portion for receiving the interposer. The mirror 204 is used to bend light. The guide pins 205 are used to align for engaging with an external optical component. The lens array 202 and 203 are used to focus, collimate or guide light. The lens array 202 and 203 can be used to enhance the efficiency of optical usage and to increase the allowable value of the package of optical components.

Figure 3:
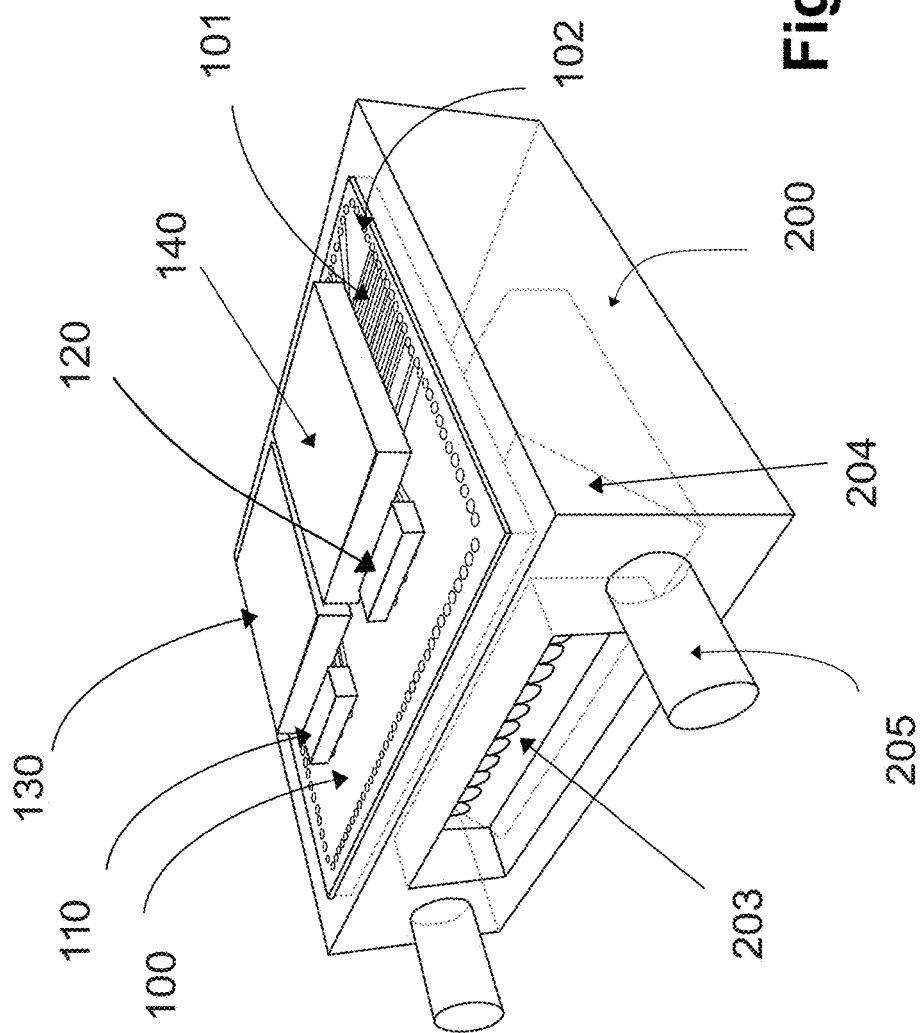
FIG. 3 is a perspective view showing the photoelectric conversion module according to an embodiment of the invention.

As shown in FIG. 3, it illustrates a schematic perspective view showing the photoelectric conversion module of FIG. 1. In this embodiment, the active components, the interposer 100 and the optical bench 200 in FIG. 1 are integrated. The active components are configured on the interposer 100 to form an OE (optical engine) interposer. In one embodiment, the light source chip 120, the light receiving element 110 and ICs 130, 140 are packaged on the interposer 100 by a flip-chip mounting process, and then the OE interposer is configured (disposed) into the optical bench 200 to form the photoelectric conversion module. In another embodiment, the OE interposer is configured (disposed) into the optical bench 200, and then the light source chip 120, the light receiving element 110 and the ICs 130, 140 are packaged on the interposer 100 by a flip-chip mounting process to form the photoelectric conversion module. The photoelectric conversion module may be formed by various combination depending on the requirements of applications. For example, the photoelectric conversion module is used to as a transmitter, and the OE interposer includes the light source chip 120 and the light source driver chip 140, or includes only the light source chip 120, configured on the interposer 100. In an another example, the photoelectric conversion module is used to as a receiver, and the OE interposer includes the light receiving element 110 and the driver chip (for example Transimpedance amplifier IC) 130, or includes only the light receiving element 110, configured on the interposer 100. Moreover, the photoelectric conversion module is used to as a transceiver, and the OE interposer includes the light source chip 120, the light receiving element 110 and their corresponding driver chip 140 and 130 (shown in FIG. 3), or includes only the light source chip 120 and the light receiving element 110, configured on the interposer 100.

In other words, in one embodiment, the ICs 130 and 140 are configured on the interposer 100, for example a driver IC, a control IC or a transimpedance amplifier IC, or other active component configured on the interposer 100. Moreover, the passive components may be configured on the interposer 100. In one embodiment, the ICs and the passive components may be configured on a circuit board. The conductive trace 101 is formed on the interposer 100. In one embodiment, the light source chip 120, the light receiving element 110 and the ICs 140 and 130 are packaged on the interposer 100 by a flip-chip mounting process. The conductive trace 101 on the interposer 100 can be electrically connected to the external circuits (such as bonding pads on the circuit board), for example by wire bonding or directly electrically connecting. The conductive trace 101 on the interposer 100 is electrically connected to the light source chip 120, the light receiving element 110 and the ICs 140 and 130. Material of the interposer 100 comprises silicon, silica, ceramic, or dielectric material, or the interposer 100 is flexible print circuit (FPC) as a substrate.

Size of the interposer 100 is smaller than or equal to the size of the configuration area 201a of the optical bench 200.

The photoelectric conversion module has the interposer 100 and the optical bench 200 with double sides lens array 202 and 203. In one embodiment, arrangement orientation of the lens array 202 is the same as the lens array 203. The optical bench 200 has a concave portion for the interposer 100 configured/fixed thereon, and the interposer 100 locates within the concave portion. The optical bench 200 has an another concave portion which locates front side of the optical bench 200, for the lens array 203 formed thereon. In one embodiment, the lens array 202, 203 and the mirror 204 are embedded (integrated) into the optical bench 200. A mirror or reflector 204 is integrated into the optical bench 200.

The mirror or reflector 204 is passively for optical signal generated by the light source chip 120 to be non-coplanar bending (optical reflection), and the optical signal is guided to an external optical transmission medium, such as optical fibers. Conversely, optical signals through the external optical transmission medium (optical fibers) are non-coplanar bending to guide the optical signals by the mirror 204, and received by the light receiving element 110. The mirror 204 can be fabricated to directly integrate into the optical bench 200 or the interposer 100.

The interposer 100 may be attached on the concave portion 201a of the optical bench 200 by using an adhesive material, such as epoxy, shown in FIG. 2 and FIG. 3.

As shown in FIG. 4, it illustrates a perspective view showing the photoelectric conversion module according to one embodiment of the invention. Conductive bump (for example solder bump, metal bump or gold bump) 105 may be formed on the conductive trace 101 and the conductive pads 102 for electrically connecting to the conductive trace 101 and the conductive pads 102, or electrically connecting between the conductive trace 101 and the light source chip 120, the light receiving element 110, the ICs 130 and 140, or electrically connecting between the conductive pads 102 and the light source chip 120, the light receiving element 110. In this embodiment, operating mechanism of the photoelectric conversion module used in the invention is as described below. The light source chip 120 emits light forward to the optical bench 200 and passing through the interposer 100 to the lens array 202. The lens array 202 may be used to make divergent light emitted by the light source chip 120 to form an approximately collimated light, and then reflecting by the mirror 204 to the lens array 203 for focusing the emitted light and propagating to the external transmission medium (optical fibers or waveguide). On the other hand, light created by the external device feeds into the optical fibers, passing through the lens array 203 to form an approximately collimated light and reflecting by the mirror 204 to pass through the lens array 202 for focusing light and passing through the interposer 100, and thereby receiving the inputted light by the light receiving element 110.

Figure 5A:
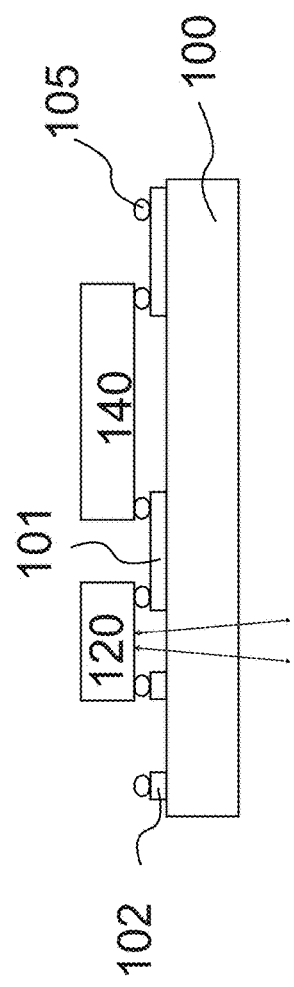
FIG. 5A illustrates a schematic perspective view showing active components configured on the interposer according to an embodiment of the invention.
Figure 5B:
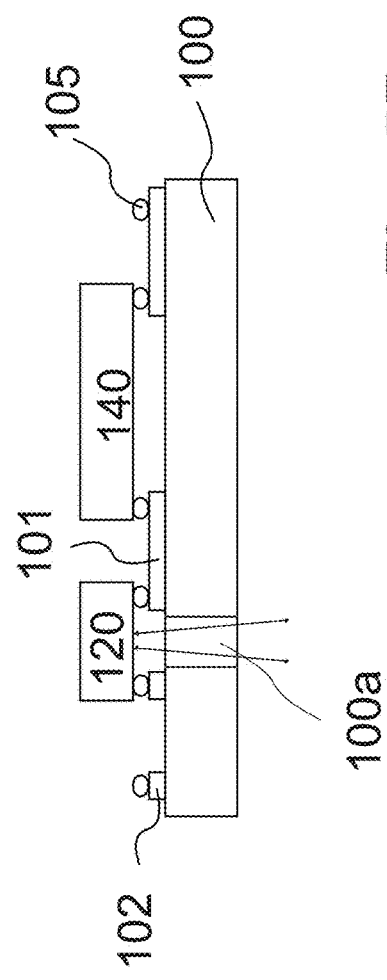
FIG. 5B illustrates a schematic perspective view showing active components configured on the interposer with through hole according to an embodiment of the invention.

The interposer 100 is allowable for optical path penetrating therein, for facilitating light emitted from the light source chip 120 or coming from external devices passing through therein, shown in FIG. 5A. In another embodiment, the interposer 100 has a through hole 100a passing through a top surface of the interposer 100 to a bottom surface of the interposer 100 allowable for optical path penetrating therein, for facilitating light emitted from the light source chip 120 or coming from external devices passing through therein, shown in FIG. 5B. The light source chip 120 is capable of emitting visible and invisible light. The light source chip 120 is for example a laser, infrared light or a light emitting diode (LED). Infrared light is in infrared band, which can be emitted by laser or LED. In some embodiments, the selected wavelength of the light source 120 needs to meet the requirement of design configuration of the interposer 100. For example, as material 100 of the interposer is Si (silicon), when the wavelength of the light source chip 120 is larger than 1100 nm, then the optical signal can penetrate through the silicon substrate, as shown in FIG. 5A. When the wavelength of the light source chip 120 is less than 1100 nm, because the optical signal can not penetrate through the silicon substrate, the through hole 100a is formed in the silicon substrate (by using a perforation process) for light passing, in order to avoid light obscured by the silicon substrate, as shown in FIG. 5B. However, as shown structure of FIG. 5B, the operating wavelength is not to be limited, that is the operating wavelength larger than or equal to 1100 nm can also be used in this structure. The top view and back view of the interposer 100 having a plurality of through holes 100a refer to FIG. 6A and FIG. 6B. The conductive trace 101 and the conductive pads 102 are formed on the top surface of the interposer 100 and the plurality of through holes 100a are passing through from the upper surface to the lower surface of the interposer 100, as shown in FIG. 6A and FIG. 6B.

In the aforementioned operating mechanism of the photoelectric conversion module, as the light source chip 120 and the light receiving element 110 can successfully communicate the optical signal between the photoelectric conversion module and an external device, the light source chip 120 and the light receiving element 110 need to align with their below lens array 202. For generally aligning manner, an active area (alignment portion) of the light source chip 120 and the light receiving element 110 is directly aligned with the lens array 202. However, because the distance between the light source chip 120, the light receiving element 110 and the lens array 202 is too long (e.g., greater than 300 micrometers (µm)) for more difficult alignment, it is often necessary to use active alignment to achieve the required standard. In the present invention, the interposer 100 may be provided to integrate the above-mentioned chips, and it can also shorten the alignment distance between the light source chips 120, the light receiving element 110 and their below lens array 202, and thereby achieving passive alignment. That is, as the same distance, the OE interposer can be used to help the packaging machine for performing the alignment of relative position to shorten the alignment distance, in order to reduce error of passive packaging caused by too far alignment distance. In one embodiment, the alignment methods include two steps which performing order are set according to the packaging equipment.

In one embodiment, in the first step, the interposer 100 has the plurality of through holes 100a, an active area 120a/110a of the light source chip 120/the light receiving element 110 aligns to the through hole 100a of the interposer 100, as shown in FIG. 7A. In one example, pattern of the active area and the through hole is also round shape. In this step, the aligning through holes 100a locate on the circuit layer (i.e., conductive trace and conductive pads) of the interposer 100, as shown in FIG. 6A. After aligning, the light source chip 120, the light receiving element 110, the ICs 130 and 140 are mounted (packaged) on the interposer 100 by a flip-chip mounting process, as shown in FIG. 7B.

Figure 8B:
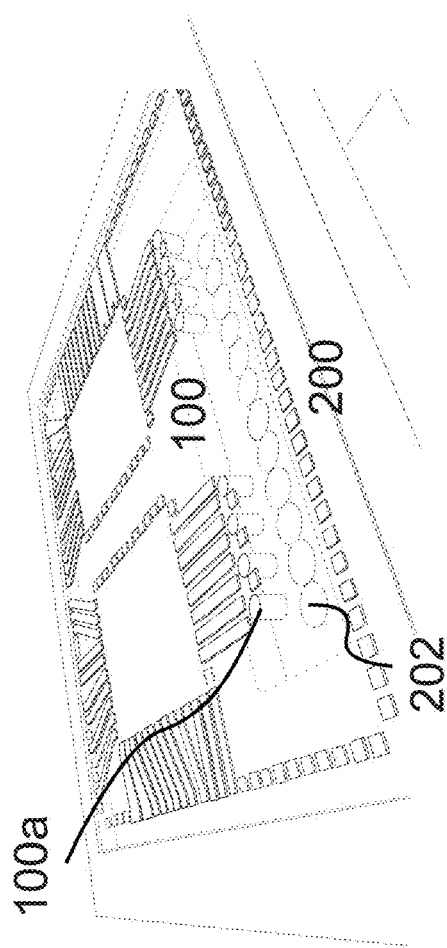
FIG. 8B illustrates a schematic perspective view showing the interposer mounted on the optical bench according to an embodiment of the invention.
Figure 8A:
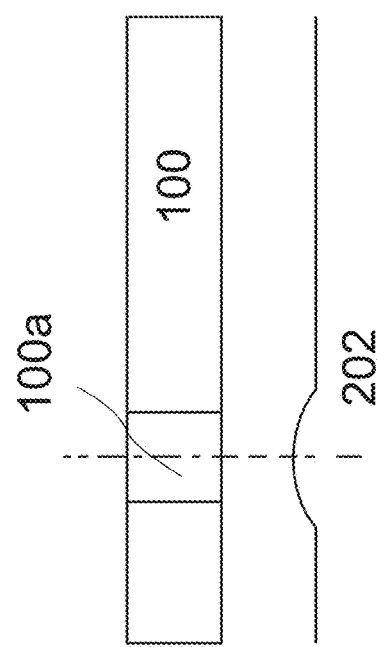
FIG. 8A illustrates a schematic perspective view showing through hole of the interposer aligning to lens array on the optical bench according to an embodiment of the invention.

Pattern of the lens array 202 and 203 located on the optical bench 200 is for example round shape, such as non-spherical lens or spherical lens. In the second step, after the light source chip 120, the light receiving element 110, the ICs 130 and 140 are mounted (packaged) on the interposer 100 to form an OE interposer, round hole (back side of the interposer 100, shown in FIG. 6B) of the through hole 100a of the interposer 100 is then aligned to the round shape of the lens array 202 of the optical bench 200, as shown in FIG. 8A. After aligning, the interposer 100 is attached (mounted) on the placement area defined by the fixing portion 201 of the optical bench 200 by using an adhesive material (such as epoxy), as shown in FIG. 8B.

The first step and the second step can be exchanged. After performing the two steps, a whole photoelectric conversion module is therefore completed.

Figure 10:
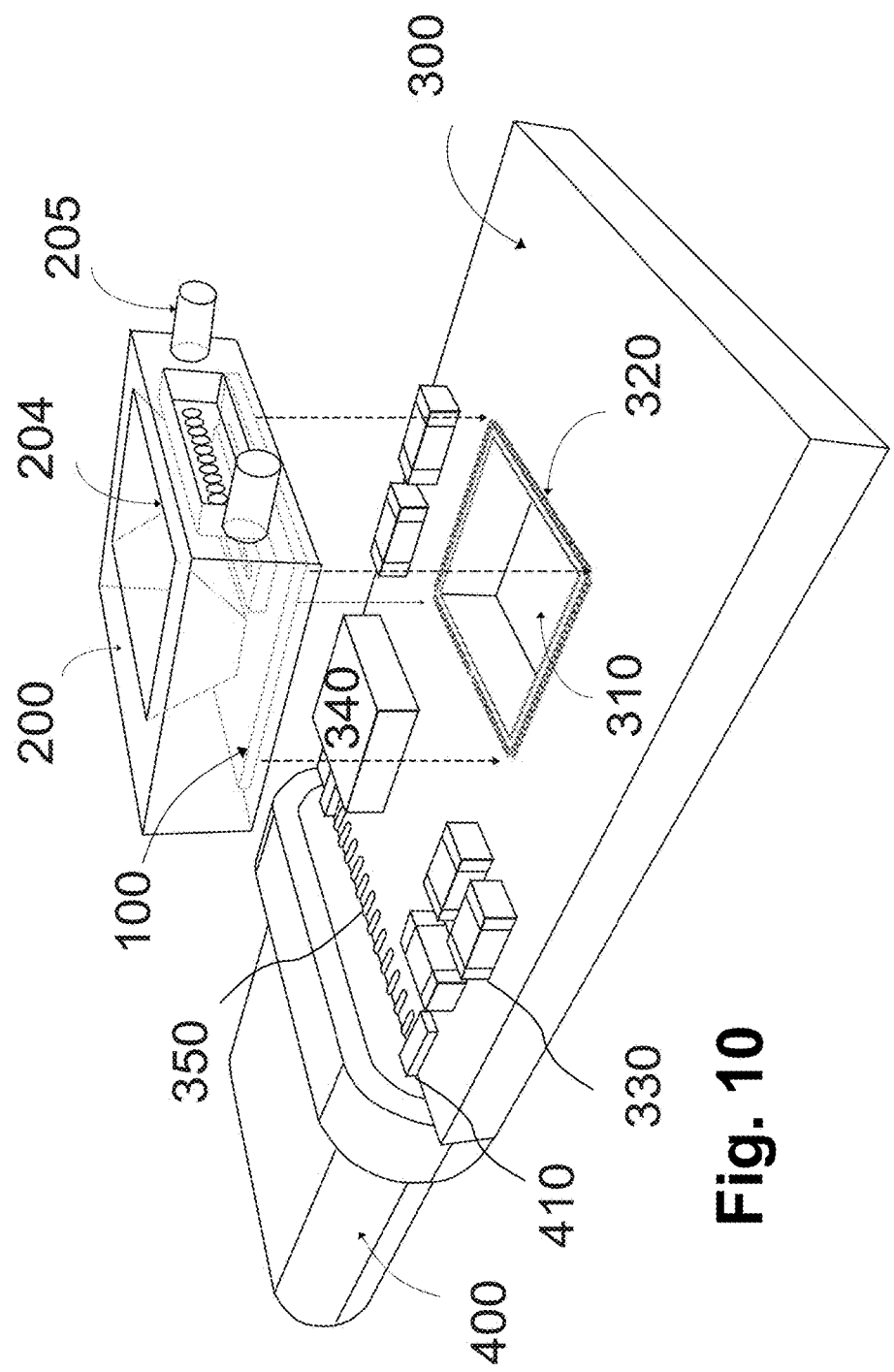
FIG. 10 illustrates a perspective view showing the photoelectric conversion assembly packaging on a circuit board according to one embodiment of the invention.

Subsequently, the photoelectric conversion module may be further attached on a circuit board 300 by using an adhesive material, such as epoxy, as shown in FIG. 9. In this process, conductive bumps are mounted to the conductive pads of the photoelectric conversion module and the conductive pads of the circuit board such that the photoelectric conversion module is mounted/attached on the circuit board 300. The package strength may be insufficient by simply conductive bumps bonding, so the adhesive material is coated to enhance the package strength and protect the electronic components of the photoelectric conversion module. In this step, the OE interposer of photoelectric conversion module faces to the circuit board 300, and the circuit board 300 is provided with a concave portion 310 for the active components of the photoelectric conversion module to be accommodated therein. Namely, the circuit board 300 is performed by a drilling process to form a space for accommodating the active components, to avoid between the light source chip 120/the light receiving element 110, ICs 130/140 and the circuit board 300 creating a spatial interference; i.e. the active elements embedded into the concave portion 310, and other parts remain on the top surface of the circuit board 300. In another embodiment, substrate of the circuit board 300 is penetrated to form an opening area by a drilling process. As shown in FIG. 10, the circuit board 300 has bonding pads 320 formed thereon. The bonding pads 320 are used for electrically connecting the conductive pads 102 on the interposer 100. In this embodiment, the photoelectric conversion module is structurally and electrically connecting with the external circuit board 300 by metal butt-joint connection, such as by using the metal bump 105 for directly docking (butt-joint connecting) the conductive pads 102 of the interposer 100 and the bonding pads 320 of the circuit board 300, and therefore the circuit (conductive trace 101) on the interposer 100 is connected with the circuit on the circuit board 300, so the photoelectric conversion module can communicate with the external signal modules for bidirectional or unidirectional signal communication. A conductive terminal 410 of a plug 400 can be soldered on bonding pads 350 of the circuit board 300, or directly soldered on the circuit board 300, as shown in FIG. 10. In another embodiment, the bonding pads 350 of the circuit board 300 can also be directly inserted into the external connector (receptacle), without connecting to the plug 400. In one embodiment, the circuit board 300 is provided with at least one integrated circuit chip 340 or at least one passive element 330 configured (disposed) on the circuit board 300. The bonding pads 350 of the circuit board 300 with the plug 400 is electrically connected with the bonding pads 102 of the interposer 100 through the conductive bumps 105. Similarly, partial bonding pads 320 of the circuit board 300 is not connected to the conductive trace 101, and such bonding pads 320 are used to be as function of support, and can even disperse the heat source generated by the active components and the passive elements.

According to the foregoing, when the photoelectric conversion module is connected to the circuit board 300, these active components are embedded into the concave portion (drilling bore) 310 in order to avoid space interference with the circuit board 300. In one embodiment, the concave portion 310 is passing through the top surface to the lower surface of the circuit board 300 to form an opening (drilling bore). The bonding pads 102 of the interposer 100 are electrically connected to the bonding pads 320 of the circuit board 300 through the conductive bumps (which may be gold bumps, gold balls, solder paste, solder ball) 105. The conductive bumps may be selectively formed on photoelectric conversion module or the circuit board 300, or formed on the photoelectric conversion module and the circuit board 300.

Figure 11:
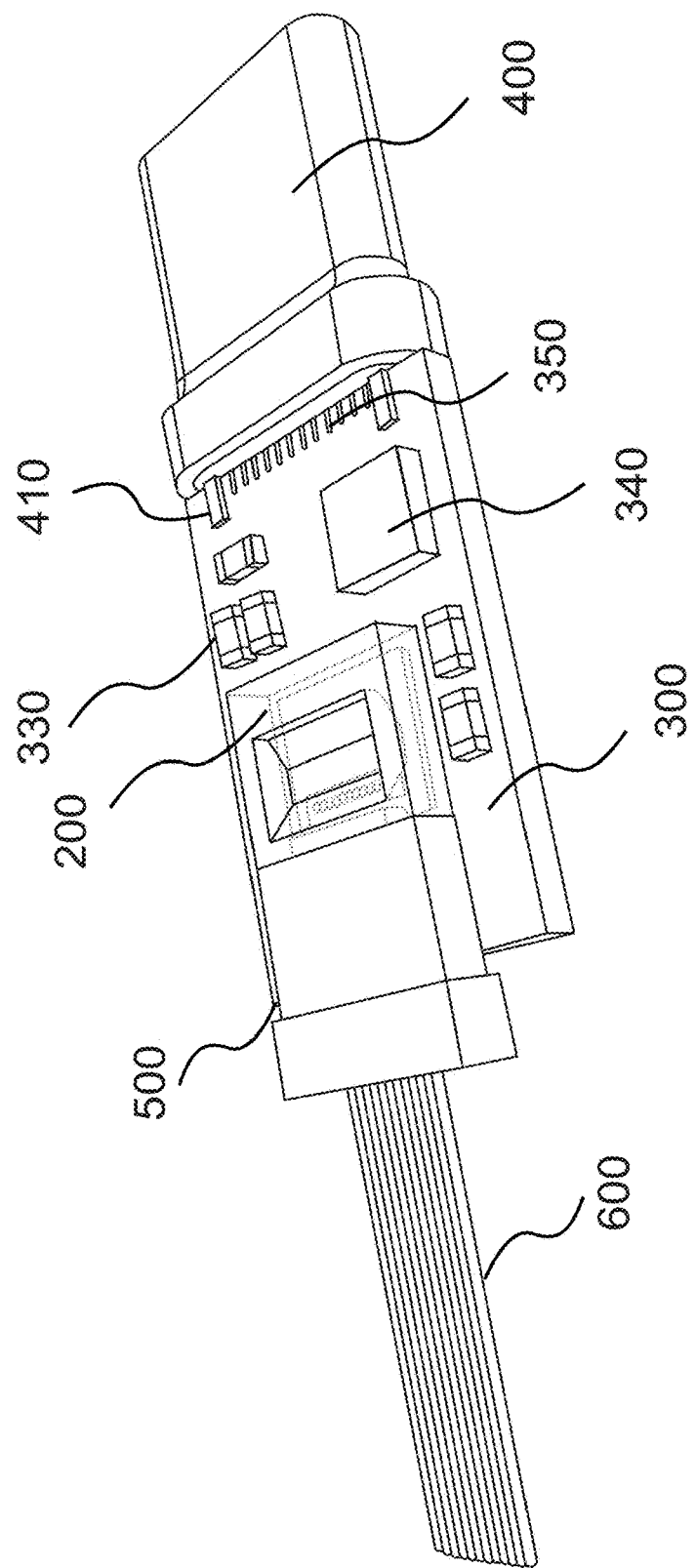
FIG. 11 illustrates the photoelectric conversion module mounted on an external circuit board and engaged with an external optical transmission member via guide pin according to one embodiment of the invention.

FIG. 11 illustrates the photoelectric conversion module mounted on an external circuit board and engaged with an external optical transmission member via guide pin according to one embodiment of the invention. In this embodiment, the photoelectric conversion assembly comprises a photoelectric conversion module, a circuit board 300, and an optical transmission member 600, wherein the photoelectric conversion module can be used for unidirectional transmission or bidirectional transmission. In one embodiment, the photoelectric conversion module includes an optical bench 200 and an interposer 100. In another embodiment, the photo-electric transmission cable is a hybrid cable, including fiber elements 600 and wires 700.

In one embodiment, the optical ferrule 500 includes a fiber connecting portion and an optical bench connecting portion for connecting the optical transmission member (optical fiber) 600 and the optical bench 200 respectively, as shown in FIG. 11. The optical ferrule 500 may be as a connection portion (joint) of the external optical transmission medium (optical fiber). The receiving holes, bores or grooves extend through from the front surface of the fiber connecting portion to the rear surface of the optical bench connecting portion. In one embodiment, the fiber connecting portion and the optical bench connecting portion may be integrally fabricated.

The optical bench connecting portion includes a mating recess (guide holes) formed therein for receiving the guide pins 205. The optical bench 200 also includes the guide pins 205. As depicted in FIG. 11, a mating portion (guide pins) 205 may be engaged into the mating recess (guide holes) of the optical bench connecting portion of the optical ferrule 500. In the depicted FIG. 11, the guide pins 205 is located adjacent sides of the lens array 203 of the optical bench 200. In one embodiment, the guide holes extend through the optical bench connecting portion, or through the front surface of the fiber connecting portion to the rear surface of the optical bench connecting portion. The guide pins 205 of the optical bench 200 aligns to the mating recess (guide holes) of the optical bench connecting portion to facilitate aligning and connecting the optical bench connecting portion of the optical ferrule 500 and the optical bench 200 of the photoelectric conversion module when the guide pins 205 matches the mating recess (guide holes) of the optical bench connecting portion. In one embodiment, the guide pin 205 and the optical bench 200 are integrally manufactured. In another embodiment, the guide pin 205 and the optical ferrule 500 are integrally manufactured, and the optical bench 200 has guide holes for engaging with the optical ferrule 250.

Figure 12:
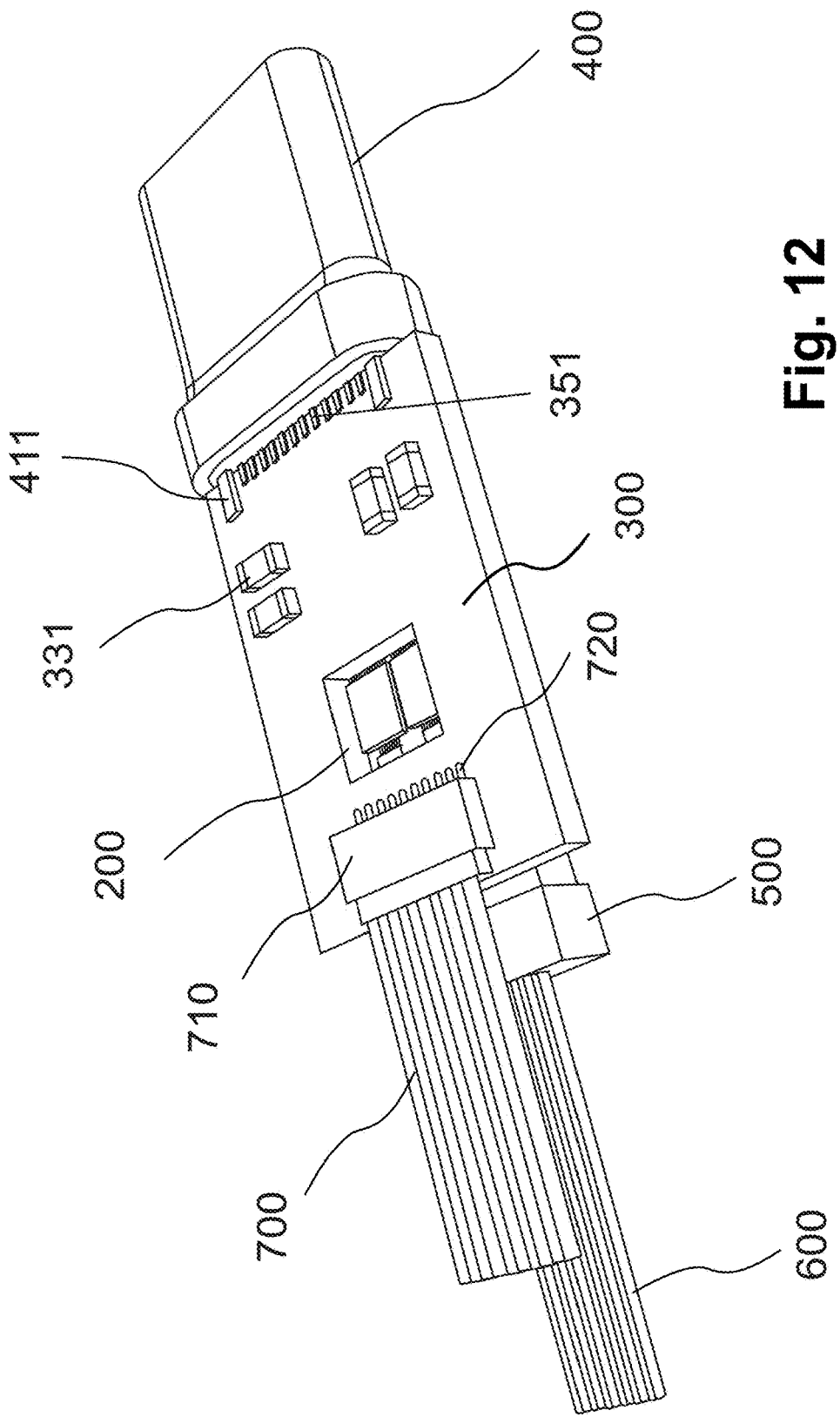
FIG. 12 illustrates the photoelectric conversion module mounted on an external circuit board and engaged with an external optical transmission member via guide pin, electrical wires coupled to the circuit board according to one embodiment of the invention.
Figure 13:
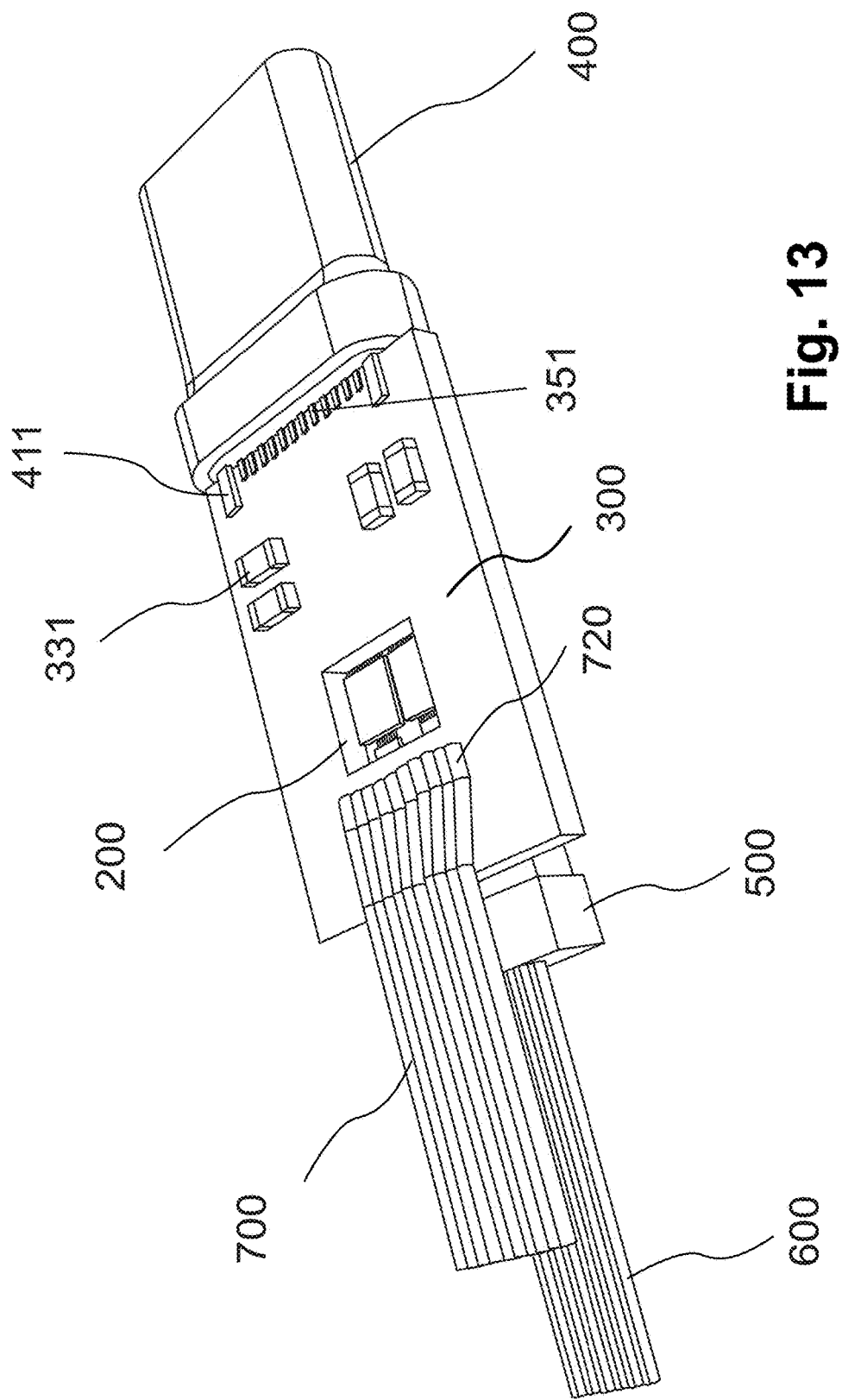
FIG. 13 illustrates the photoelectric conversion module mounted on an external circuit board and engaged with an external optical transmission member via guide pin, electrical wires coupled to the circuit board according to another embodiment of the invention.

In one embodiment, the optical transmission member 600 is single mode fibers or multimode fibers, an optical ribbon fiber or bundle fiber. The number of the optical fiber depends on the requirement of practical applications. The optical ribbon fiber has optical fibers inserted into receiving holes, bores or grooves of the optical ferrule 500 for electrically coupling to optical elements configured on the interposer 100. The optical fibers are inserted into the optical ferrule 500 for coupling/connecting (engaging) to the photoelectric conversion module. The receiving holes or bores are generally cylindrical. For example, the optical fibers are multimode fibers or single mode fiber. The optical fibers aligned in series are multimode fibers that are included in the optical ribbon fiber 600. Each of the optical fibers has a core formed at a center thereof, a cladding surrounding the core, and a coating layer coated on an outer surface of the cladding in order to protect the core and the cladding, wherein reflective index (n) of the core is 1.35~1.70 and reflective index of the cladding is 1.35~1.70. The optical fibers are for example 50/125, 62.5/125, or 80/125 graded index (GI) multimode fibers. In another embodiment, the optical transmission component 600 may be as an optical waveguide, e.g., manufactured by a flexible substrate. The external transmission cable may also be photo-electric composite cable (hybrid cable), that includes the above mentioned optical transmission member 600 for transmitting optical signals, and electrical wires 700 to transmit electrical signals or supply power source. The electrical wires 700 may be inserted into a connector 710 being soldered and then electrically connected to the bonding pads 720 on the circuit board 300, as shown in FIG. 12. In addition, the electrical wires 700 may be directly soldered on the bonding pads 720 of the circuit board 300, as shown in FIG. 13. The bonding pads 720 and bonding pads 351 are configured on the other side of the circuit board 300 to facilitate electronic components for electrical connection. The other side of the circuit board 300 may comprise at least one integrated circuit chip, or at least a passive element 331 configured thereon. A conductive terminal 411 of the plug 400 may be soldered to the bonding pads 351 on the circuit board 300, or directly soldered on the circuit board 300. For a single optical transmission or a hybrid signal transmission, the bonding pads 350 are need to connect to the plug 400. The bonding pad 350 can also be directly inserted into the external connector without through the plug.

The rear ends of the plural optical fibers are fixed to an end of the optical bench connecting portion of the optical ferrule 500. The photoelectric conversion module has a function of converting an optical signal (via the plural optical fibers) from external electrical apparatus or equipment into an electrical signal, or transmitting an optical signal to the external electrical apparatus or equipment via the plural optical fibers.

In one embodiment, ICs are, for example a driver integrated circuit (IC), a control IC or a trans-impedance amplifier (TIA) chip, or others active components, configured on the interposer. The driver IC may be used to drive the light source chip (such as optoelectronic device) for emitting light.

Material and thickness of the flexible waveguide portion may be selected, based-on requirements for practical applications. For example, material of the flexible waveguide portion includes polymer material, dielectric material, such as polyimide.

In one embodiment, the optical bench combines with the interposer having flexible waveguide (optical waveguide portion) for optical communication. Such structure may receive and transmit optical signal through the flexible waveguide. Light created by the light source chip may be reflected via the optical micro-reflection surface at one side of the flexible substrate.

As noted above, the flexible waveguide (optical waveguide portion) of the flexible substrate includes an under cladding layer, a core and an over cladding layer. Materials of the under cladding layer, the core and the over cladding layer are not specifically limited, and it is possible to used, e.g., an acrylic resin, an epoxy resin and a polyimide resin, etc.

The conductive trace on the interposer may be electrically connected to ICs or the circuit board by wire bond or flip board for signal connection.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A photoelectric conversion assembly, comprising:
   a photoelectric conversion module having an interposer with a conductive trace and first conductive pads formed on said interposer;
   at least one optical element configured on said interposer to couple to said conductive trace and said first conductive pads;
   an optical bench for said interposer configured thereon;
   a first lens array configured to align said at least one optical element;
   a mirror configured to bend light emitted by said at least one optical element;
   a second lens array configured to guide said light emitted by said at least one optical element;
   a circuit board for supporting said photoelectric conversion module, having second conductive pads for coupling said photoelectric conversion module and said first conductive pads;
   an optical transmission member for transmitting light; and
   a conductive bump formed to couple to said conductive trace and said first conductive pads;
   wherein said circuit board has a concave portion for receiving said at least one optical element on said interposer.

2. The photoelectric conversion assembly of claim 1, wherein said optical bench has a first concave portion for said first lens array formed thereon.

3. The photoelectric conversion assembly of claim 2, wherein said optical bench has a second concave portion for said second lens array formed thereon.

4. The photoelectric conversion assembly of claim 3, wherein arrangement orientation of said first lens array is the same as said second lens array.

5. The photoelectric conversion assembly of claim 1, wherein said first lens array, said second lens array and said mirror are formed on said optical bench.

6. The photoelectric conversion assembly of claim 1, wherein said at least one optical element is a light source chip, a photo diode chip, a photo detector chip or a photosensitive chip.

7. A photoelectric conversion assembly, comprising:
   a photoelectric conversion module having an interposer with a conductive trace and first conductive pads formed on said interposer;
   at least one optical element configured on said interposer to couple to said conductive trace and said first conductive pads;
   an optical bench for said interposer configured thereon;
   a first lens array configured to align said at least one optical element;
   a mirror configured to bend light emitted by said at least one optical element;
   a second lens array configured to guide said light emitted by said at least one optical element;
   a circuit board for supporting said photoelectric conversion module, having second conductive pads for coupling said photoelectric conversion module and said first conductive pads;
   an optical transmission member for transmitting light; and
   a conductive bump formed to couple to said conductive trace and said first conductive pads.

8. The photoelectric conversion assembly of claim 7, further comprising at least one IC formed on said interposer.

9. The photoelectric conversion assembly of claim 8, wherein said at least one IC is a driver integrated circuit (IC), a control IC or a trans-impedance amplifier (TIA) chip.

10. The photoelectric conversion assembly of claim 7, wherein said interposer is attached on said optical bench by using an adhesive material.

11. A photoelectric conversion assembly, comprising:
    a photoelectric conversion module having an interposer with a conductive trace and first conductive pads formed on said interposer;
    at least one optical element configured on said interposer to couple to said conductive trace and said first conductive pads;
    an optical bench for said interposer configured thereon;
    a first lens array configured to align said at least one optical element;
    a mirror configured to bend light emitted by said at least one optical element;
    a second lens array configured to guide said light emitted by said at least one optical element;
    a circuit board for supporting said photoelectric conversion module, having second conductive pads for coupling said photoelectric conversion module and said first conductive pads; and
    an optical transmission member for transmitting light;
    wherein said interposer has at least one through hole passing through a top surface to a bottom surface of said interposer.

12. The photoelectric conversion assembly of claim 11, further comprising further comprising an optical ferrule for engaging with said photoelectric conversion module and said optical transmission member.

13. The photoelectric conversion assembly of claim 12, further comprising a guide pin for engaging said optical ferrule and said optical bench.

14. The photoelectric conversion assembly of claim 13, wherein said interposer is attached on said first concave portion of said optical bench by using an adhesive material.

15. The photoelectric conversion assembly of claim 11, further comprising at least one IC formed on said circuit board.

16. A photoelectric conversion assembly, comprising:
   a photoelectric conversion module having an interposer with a conductive trace and first conductive pads formed on said interposer;
   at least one optical element configured on said interposer to couple to said conductive trace and said first conductive pads;
   an optical bench for said interposer configured thereon;
   a first lens array configured to align said at least one optical element;
   a mirror configured to bend light emitted by said at least one optical element;
   a second lens array configured to guide said light emitted by said at least one optical element;
   a circuit board for supporting said photoelectric conversion module, having second conductive pads for coupling said photoelectric conversion module and said first conductive pads; and
   an optical transmission member for transmitting light;
   wherein said circuit board has a concave portion for receiving said at least one optical element on said interposer.

17. The photoelectric conversion assembly of claim 16, wherein said optical bench has a fixing portion for supporting and positioning said interposer.

18. The photoelectric conversion assembly of claim 16, further comprising a plug coupled to said circuit board.

19. The photoelectric conversion assembly of claim 16, wherein a size of said interposer is less than or equal to a size of said optical bench.

20. The photoelectric conversion assembly of claim 16, further comprising at least one passive component formed on said circuit board.

* * * * *